United States Patent
Basol et al.

(10) Patent No.: US 7,897,416 B2
(45) Date of Patent: **\*Mar. 1, 2011**

(54) COMPOSITION CONTROL FOR PHOTOVOLTAIC THIN FILM MANUFACTURING

(75) Inventors: Bulent M. Basol, Manhattan Beach, CA (US); Serdar Aksu, Milpitas, CA (US)

(73) Assignee: SoloPower, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/816,242

(22) Filed: Jun. 15, 2010

(65) Prior Publication Data

US 2010/0317129 A1    Dec. 16, 2010

Related U.S. Application Data

(63) Continuation of application No. 11/696,643, filed on Apr. 4, 2007, now Pat. No. 7,736,913.

(51) Int. Cl.
   *H01L 21/66* (2006.01)
(52) U.S. Cl. .................. 438/8; 438/9; 438/13; 438/16; 438/17; 438/93; 438/95; 438/494; 257/E21.53; 257/E21.531
(58) Field of Classification Search .......... 438/8, 438/9, 13, 16, 17, 93, 95, 494; 257/E21.53, 257/E21.531
See application file for complete search history.

(56) References Cited

U.S. PATENT DOCUMENTS

| | | | | |
|---|---|---|---|---|
| 4,581,108 A * | 4/1986 | Kapur et al. | ................ | 205/170 |
| 4,659,437 A * | 4/1987 | Shiba et al. | ................ | 205/84 |
| 4,798,660 A * | 1/1989 | Ermer et al. | ............ | 204/192.17 |
| 4,915,745 A * | 4/1990 | Pollock et al. | .............. | 136/265 |
| 5,275,714 A * | 1/1994 | Bonnet et al. | ................ | 205/109 |
| 5,326,455 A * | 7/1994 | Kubo et al. | ................... | 205/77 |
| 5,730,852 A * | 3/1998 | Bhattacharya et al. | ...... | 205/192 |
| 5,871,630 A * | 2/1999 | Bhattacharya et al. | ...... | 205/192 |
| 6,117,703 A * | 9/2000 | Penndorf | ..................... | 438/63 |
| 6,423,565 B1 * | 7/2002 | Barth et al. | .................... | 438/57 |
| 6,428,673 B1 * | 8/2002 | Ritzdorf et al. | ............... | 205/84 |
| 6,444,481 B1 * | 9/2002 | Pasadyn et al. | ................ | 438/5 |
| 6,630,360 B2 * | 10/2003 | Christian et al. | ............... | 438/5 |
| 6,798,068 B2 * | 9/2004 | Oglesby | ..................... | 257/759 |

(Continued)

OTHER PUBLICATIONS

Guillen, C., et al, "CuInSe2 thin films obtained by a novel electrodeposition and sputtering method combined", Vacuum 58 (2000) pp. 594-601.*

*Primary Examiner*—George Fourson
(74) *Attorney, Agent, or Firm*—Pillsbury Winthrop Shaw Pittman LLP

(57) ABSTRACT

The present invention relates to methods and apparatus for providing composition control to thin compound semiconductor films for radiation detector and photovoltaic applications. In one aspect of the invention, there is provided a method in which the molar ratio of the elements in a plurality of layers are detected so that tuning of the multi-element layer can occur to obtain the multi-element layer that has a predetermined molar ratio range. In another aspect of the invention, there is provided a method in which the thickness of a sublayer and layers thereover of Cu, In and/or Ga are detected and tuned in order to provide tuned thicknesses that are substantially the same as pre-determined thicknesses.

34 Claims, 3 Drawing Sheets

U.S. PATENT DOCUMENTS

| | | |
|---|---|---|
| 7,026,258 B2 * | 4/2006 | Taunier et al. .............. 438/795 |
| 7,161,689 B2 * | 1/2007 | Ritzdorf et al. ............. 356/630 |
| 7,560,641 B2 * | 7/2009 | Menezes .................... 136/264 |
| 2002/0189665 A1 * | 12/2002 | Bhattacharya .............. 136/262 |
| 2003/0219095 A1 * | 11/2003 | Watanabe et al. ............. 378/35 |
| 2006/0062902 A1 * | 3/2006 | Sager et al. ................... 427/74 |

* cited by examiner

COMPOSITION CONTROL FOR PHOTOVOLTAIC THIN FILM MANUFACTURING

CLAIM OF PRIORITY

This application is a continuation of U.S. application Ser. No. 11/696,643 filed Apr. 4, 2007, now U.S. Pat. No. 7,736,913 issued Jun. 15, 2010, which patent application claims priority to and incorporates by reference herein U.S. Provisional Appln. Ser. No. 60/744,252 filed Apr. 4, 2006 entitled "Composition Control For Photovoltaic Thin Film Manufacturing".

FIELD OF THE INVENTION

The present invention relates to methods and apparatus for preparing thin films of compound semiconductor films for radiation detector and photovoltaic applications.

BACKGROUND

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

The structure of a conventional Group IBIIIAVIA compound photovoltaic cell such as a $Cu(In,Ga,Al)(S,Se,Te)_2$ thin film solar cell is shown in FIG. 1A. The device 10 is fabricated on a substrate 11, such as a sheet of glass, a sheet of metal, an insulating foil or web, or a conductive foil or web. The absorber film 12, which comprises a material in the family of $Cu(In,Ga,Al)(S,Se,Te)_2$, is grown over a conductive layer 13 or a contact layer, which is previously deposited on the substrate 11 and which acts as the electrical contact to the device. Various conductive layers comprising Mo, Ta, W, Ti, and stainless steel etc. have been used in the solar cell structure of FIG. 1. If the substrate itself is a properly selected conductive material, it is possible not to use a conductive layer 13, since the substrate 11 may then be used as the ohmic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. It should be noted that the structure of FIG. 1A may also be inverted if substrate is transparent. In that case light enters the device from the substrate side of the solar cell.

In a thin film solar cell employing a Group IBIIIAVIA compound absorber, the cell efficiency is a strong function of the molar ratio of IB/IIIA. If there are more than one Group IIIA materials in the composition, the relative amounts or molar ratios of these IIIA elements also affect the properties. For a $Cu(In,Ga)(S,Se)_2$ absorber layer, for example, the efficiency of the device is a function of the molar ratio of Cu/(In+Ga). Furthermore, some of the important parameters of the cell, such as its open circuit voltage, short circuit current and fill factor vary with the molar ratio of the IIIA elements, i.e. the Ga/(Ga+In) molar ratio. In general, for good device performance Cu/(In+Ga) molar ratio is kept at around or below 1.0. As the Ga/(Ga+In) molar ratio increases, on the other hand, the optical bandgap of the absorber layer increases and therefore the open circuit voltage of the solar cell increases while the short circuit current typically may decrease. It is important for a thin film deposition process to have the capability of controlling both the molar ratio of IB/IIIA, and the molar ratios of the Group IIIA components in the composition. It should be noted that although the chemical formula is often written as $Cu(In,Ga)(S,Se)_2$, a more accurate formula for the compound is $Cu(In,Ga)(S,Se)_k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

The first technique used to grow $Cu(In,Ga)Se_2$ layers was the co-evaporation approach which involves evaporation of Cu, In, Ga and Se from separate evaporation boats onto a heated substrate, as the deposition rate of each component is carefully monitored and controlled.

Another technique for growing $Cu(In,Ga)(S,Se)_2$ type compound thin films for solar cell applications is a two-stage process where at least two of the components of the Cu(In,Ga)(S,Se)$_2$ material are first deposited onto a substrate, and then reacted with S and/or Se in a high temperature annealing process. For example, for $CuInSe_2$ growth, thin sub-layers of Cu and In are first deposited on a substrate to form a precursor layer and then this stacked precursor layer is reacted with Se at elevated temperature. If the reaction atmosphere contains sulfur, then a $CuIn(S,Se)_2$ layer can be grown. Addition of Ga in the precursor layer, i.e. use of a Cu/In/Ga stacked film precursor, allows the growth of a $Cu(In,Ga)(S,Se)_2$ absorber. Other prior-art techniques include deposition of Cu—Se/In—Se, Cu—Se/Ga—Se, or Cu—Se/In—Se/Ga—Se stacks and their reaction to form the compound. Mixed precursor stacks comprising compound and elemental sub-layers, such as a Cu/In—Se stack or a Cu/In—Se/Ga—Se stack, have also been used, where In—Se and Ga—Se represent selenides of In and Ga, respectively.

Sputtering and evaporation techniques have been used in prior art approaches to deposit the sub-layers containing the Group IB and Group IIIA components of metallic precursor stacks. In the case of $CuInSe_2$ growth, for example, Cu and In sub-layers were sequentially sputter-deposited from Cu and In targets on a substrate and then the stacked precursor film thus obtained was heated in the presence of gas containing Se at elevated temperatures as described in U.S. Pat. No. 4,798,660. More recently U.S. Pat. No. 6,048,442 disclosed a method comprising sputter-depositing a stacked precursor film comprising a Cu—Ga alloy sub-layer and an In sub-layer to form a Cu—Ga/In stack on a metallic back electrode and then reacting this precursor stack film with one of Se and S to form the compound absorber layer. U.S. Pat. No. 6,092,669 described sputtering-based equipment and method for producing such absorber layers.

One prior art method described in U.S. Pat. No. 4,581,108 utilizes a low cost electrodeposition approach for metallic precursor preparation. In this method a Cu sub-layer is first electrodeposited on a substrate. This is then followed by electrodeposition of an In sub-layer and heating of the deposited Cu/In precursor stack in a reactive atmosphere containing Se. Methods of fabricating more advanced metallic precursor stacks comprising Cu, In and Ga have recently been described in Applicant's copending U.S. application Ser. No. 11/081,308 filed Mar. 15, 2005 entitled "Technique and Apparatus for Depositing Thin Layers of Semiconductors For Solar Cell Fabrication"; U.S. application Ser. No. 11/266,013 filed Nov. 2, 2005 entitled "Technique And Apparatus For Depositing Layers Of Semiconductors For Solar Cell And Module Fabrication"; U.S. application Ser. No. 11/621,101 filed Jan. 8, 2007 entitled "Precursor Containing Copper Indium, And Gallium For Selenide (Sulfide) Compound Formation"; and U.S. application Ser. No. 11/462,685 filed Aug. 6, 2006 entitled "Technique For Preparing Precursor Films And Compound Layers For Thin Film Solar Cell Fabrication".

Irrespective of the specific approach used to grow a $Cu(In,Ga)(S,Se)_2$ absorber film, two molar ratios mentioned before, i.e. the Cu/(In+Ga) ratio and the Ga/(Ga+In) ratio, should be closely controlled from run to run and on large area substrates. In co-evaporation techniques, this composition control is achieved through in-situ monitoring of the evaporation rates of Cu, In, Ga and Se. In two-stage techniques, which involve deposition of sub-layers to form a precursor film and then reaction of the precursor film to form the compound absorber layer, individual thicknesses of the sub-layers forming the stacked precursor film layer need to be well controlled because they determine the final stoichiometry or composition of the compound layer after the reaction step. If the sub-layers are deposited by vacuum approaches, such as evaporation and sputtering, thicknesses of the sub-layers within the precursor layer (such as thicknesses of Cu and In sub-layers) may be monitored and controlled using in-situ measurement devices such as crystal oscillators, or sensors that sense the material deposition flux. In the prior art electroplating techniques, on the other hand, thickness of individual sub-layers such as the Cu sub-layer, In sub-layer, and/or Ga sub-layer have been controlled through control of the charge passed during deposition of the sub-layer, i.e. through control of the deposition current density and the deposition time. However, during processing, it is possible that deposition rates change. For example, in electrodeposition approach the deposition rates may vary due to reasons such as a change in the electrodeposition efficiency, age of the deposition bath, accumulation of byproducts in the bath, change in organic or inorganic additive concentrations and/or activities etc. in the electrolyte. Since solar cell efficiency is a strong function of the molar ratios of the elements within the deposited precursors, new techniques that assure excellent control of these ratios are needed.

SUMMARY OF THE INVENTION

The present invention relates to methods and apparatus for providing composition control to thin films of compound semiconductor films for radiation detector and photovoltaic applications.

In one aspect of the invention, there is provided a method in which the molar ratio of the elements in a plurality of layers are detected so that tuning of the multi-element layer can occur to obtain the multi-element layer that has a predetermined molar ratio range.

In another aspect of the invention, there is provided a method in which the thickness of a sub-layer and layers thereover of Cu, In and/or Ga are detected and tuned in order to provide tuned thicknesses that are substantially the same as pre-determined thicknesses.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein.

DETAILED DESCRIPTION OF THE PREFERRED EMBODIMENTS

The present invention overcomes the shortcomings of the prior art techniques by addressing the important manufacturability and yield issues associated with poor control of the stoichiometry or composition of Group IBIIIAVIA semiconductor layers. The technique is generally applicable to all techniques used to grow Group IBIIIAVIA semiconductor layers. It is specifically well suited to control the composition of layers grown using a two-stage technique.

Figure 1A:
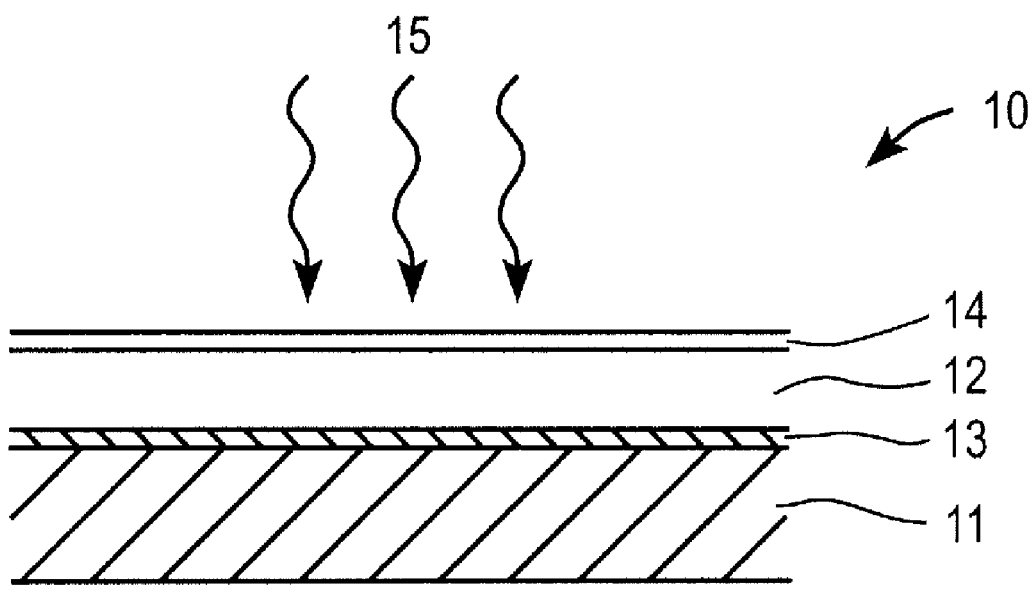
FIG. 1A is a cross-sectional view of a solar cell employing a Group IBIIIAVIA absorber layer.
Figure 1B:
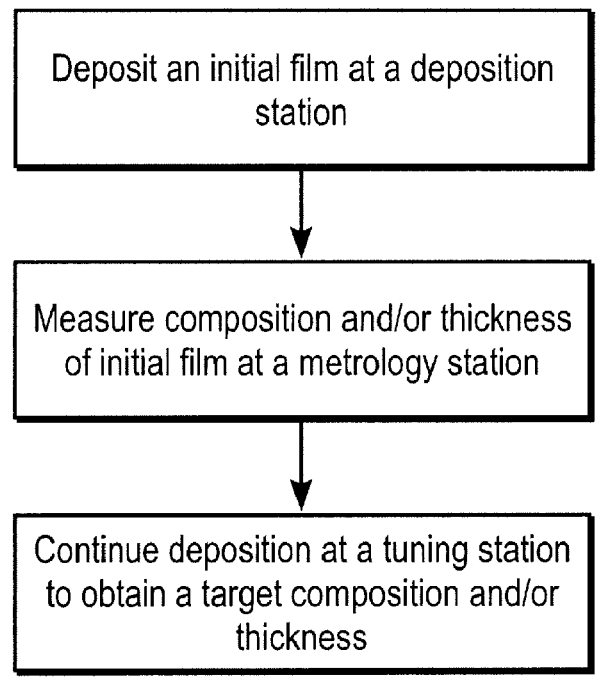
FIG. 1B is a representation of the process steps of one embodiment.

FIG. 1B shows the steps of carrying out the process of the present invention. The process comprises at least three steps. In the first step an initial film comprising at least one of a Group IB, a Group IIIA, and a Group VIA material is deposited on at least a portion of a substrate at a deposition station. In the second step the composition and/or thickness of the initial film on the portion of the substrate is measured in a metrology station. In the third step, based on the information from the second step, an additional film is deposited on the portion at a tuning station to bring the composition and/or thickness of the total film to a target value, wherein the total film is defined as the sum of the initial film and the additional film. These three steps may then be repeated for better accuracy in reaching the target value. The deposition processes carried out at the deposition station(s) and at the tuning station(s) may be selected from a variety of techniques such as evaporation, sputtering, electroplating, electroless plating, ink deposition, melt deposition etc. These techniques may be mixed also. For example, an evaporation technique may be used in the deposition station and an electroplating technique may be used in the tuning station. Furthermore, there may be more than one deposition station and more than one tuning station to first deposit the initial layer and then to bring the composition/thickness of the total film to the target value. Various measurement methods may be used at the metrology station(s). These methods include, but are not limited to X-ray fluorescence, X-ray diffraction, X-ray reflectance, profile thickness measurement, optical reflectance, ellipsometry, 4-point probe measurement etc.

Figure 2A:
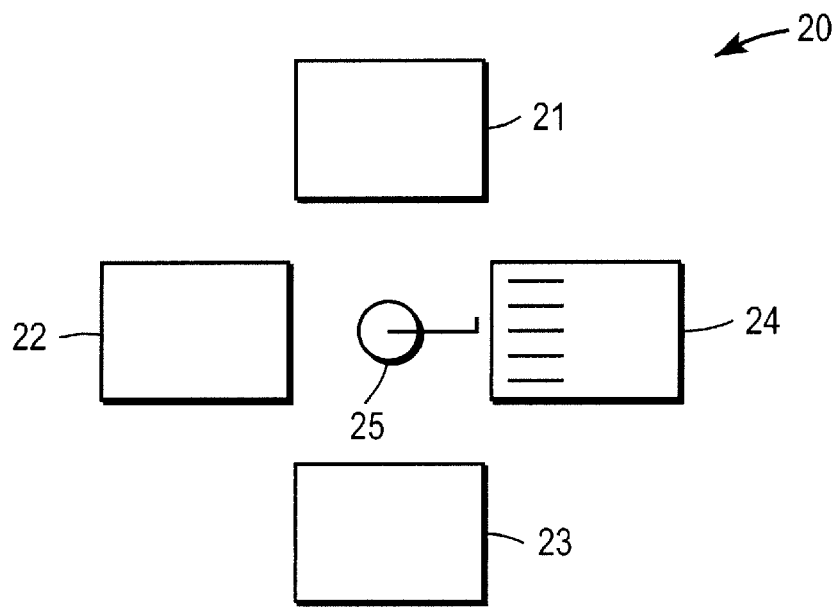
FIG. 2A shows a cluster tool configuration with various chambers around a central handler.

The deposition station(s), metrology station(s) and tuning station(s) may be placed in a system in various configurations. For example, FIG. 2A shows a cluster-tool 20 configuration including a deposition station 21, a metrology station 22, a tuning station 23, a load-unload station 24 and a handler 25 to transport the substrates between various stations. It should be noted that one or more deposition stations, one or more metrology stations, one or more tuning stations, one or more load-unload stations, as well as one or more other stations such as cleaning and/or drying stations, heating stations, reaction stations etc. may also be added to the cluster-tool 20 of FIG. 2.

Figure 2B:
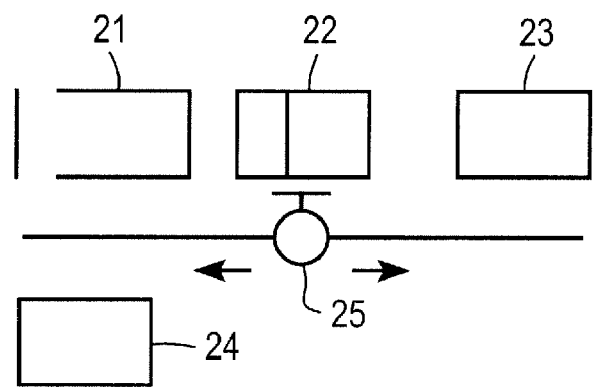
FIG. 2B shows an in-line tool configuration with composition control capability in accordance with one embodiment of the invention.

The deposition station(s) 21, metrology station(s) 22, tuning station(s) 23 and load-unload station(s) 24 may also be placed in-line manner as shown in FIG. 2B and the handler 25 move linearly to move the substrates between various stations.

In one embodiment the deposition station and the tuning station are two different stations. In other words, after an initial film is deposited on a substrate at a deposition station and then measured at a metrology station, an additional film is deposited over the initial film at a tuning station that is different from the deposition station. Alternately, the deposition station and the tuning station may be the same station. For example, an initial film may be deposited on a substrate at a deposition station. The substrate may then be moved to a metrology station for measurement of the initial film. Then the substrate may be moved back to the same deposition station to deposit an additional film over the initial film and to achieve the target values of thickness and/or composition. In this case the deposition station acts as a tuning station when the substrate is moved into it for the second time. As stated before, it is possible that substrate goes through more than one deposition stations before arriving at the metrology station. It may then be moved to more than one tuning stations to achieve the target composition and/or thickness of the deposited total film. Metrology stations may also be more than one, each measuring a different important parameter, for example one measuring composition and another one measuring thickness.

Figure 3:
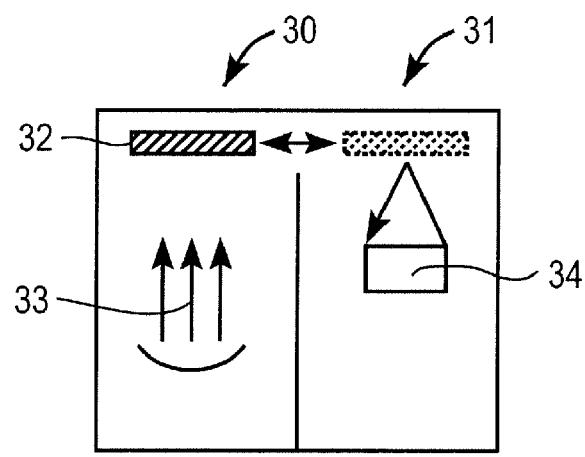
FIG. 3 shows an integrated deposition station/metrology station pair.

A specific configuration where the deposition station and the tuning station are the same is schematically shown in FIG. 3. The configuration in FIG. 3 comprises a deposition station 30 and a metrology station 31. A substrate 32 is first placed in the deposition station 30 and an initial film is deposited onto the substrate 32 as schematically indicated by arrows 33. Then, as shown by the dotted lines, the substrate 32 is moved into the metrology station 31 and measurements are carried out on the initial film using a metrology tool 34. The substrate 32 is then moved back into the deposition station 30 to further deposit an additional film so that a target total film thickness and/or composition is reached.

In another embodiment, the present invention may be used in controlling the composition of a precursor layer employed in a two-stage method where during the first stage of the process sub-layers comprising at least one of a Group IB, a Group IIIA and a Group VIA material are deposited on a substrate to form the precursor layer, and during the second stage a reaction is carried out to convert the precursor layer into a Group IBIIIAVIA compound layer. In this case the sub-layer deposition process is divided into at least two deposition steps and a measurement step is provided between the at least two deposition steps. The first deposition step deposits an initial sub-layer. If the deposited sub-layer comprises only one element, the measurement step measures the thickness of the initial sub-layer. If the deposited sub-layer comprises more than one element, such as an alloy, the measurement step may measure the effective thickness of each element or it may measure the composition of the sub-layer. The subsequent deposition step(s) after the measurement step then are used to bring the total thickness or the composition of the sub-layer to a targeted value. The invention will now be described using various examples.

Example 1

A Cu(In,Ga)Se$_2$ compound layer with a Cu/(In+Ga) ratio of 0.95 and Ga/(Ga+In) ratio of 0.3 may be grown using the present invention by first depositing a Cu/In/Ga precursor stack on a substrate and then reacting the stack with selenium, i.e. by selenizing the stack. It is straight forward to calculate that if the thickness of the Cu sub-layer in the stack is 200 nm, an In sub-layer thickness of 325 nm and a Ga sub-layer thickness of 104 nm would be needed to provide the target composition defined above. In processing such a precursor stack, the following steps may be carried out: i) a nominally 200 nm thick Cu sub-layer may be first deposited on at least one portion of a substrate at a first deposition station using optimized conditions and in-situ thickness control means, ii) deposited Cu sub-layer thickness on the portion of the substrate may be determined at a metrology or measurement station, iii) if the thickness measured is within an acceptable range (such as within +/−5%) of the desired 200 nm, the portion may be moved to another process station to continue with In deposition, iv) if the thickness measured is outside the desired range, the portion may be moved to tuning station to adjust the thickness to the desired range, v) the above steps may be repeated for In deposition and Ga deposition.

It should be noted that the approach of the present invention may be used for the deposition of all the sub-layers or only for sub-layers for which deposition thickness control is difficult, unstable or non-optimized. For example, the approach of the present invention may be used for the deposition of the Cu and Ga sub-layers and may not be used for the deposition of the In sub-layer if the deposition method for the In sub-layer offers already a good thickness control.

Example 2

Let us now take, as an example, an electroplating technique used to manufacture Cu/In/Ga precursor stacks on a large number of substrates, such as hundreds or thousands of substrates which may each be 1 ft×1 ft or 1 ft×4 ft in size. Starting with a fresh Cu plating solution or electrolyte, it may be possible to deposit accurately the 200 nm thick Cu layer on the substrates early in the process by applying a pre-determined current density for a pre-determined time. As more and more substrates are electroplated, however, the electrolyte may start to age and the plating efficiency of Cu may drop from its initial value, which may be in the range of 70-100% depending on the chemistry used. Therefore, although the early substrates receive nominally 200 nm thick Cu, the Cu thickness on later substrates may start to decrease. If this reduction of Cu thickness goes un-detected and if the In and Ga thicknesses are accurate, the Cu/(In+Ga) molar ratio in the precursor stack would be lower than the targeted value which, for example may be around 0.95. This would lower the yields once the precursors are converted into $Cu(In,Ga)Se_2$ compound layers and solar cells are fabricated on the compound layers. To avoid this problem, the method of the present invention measures at a metrology station the thickness of the deposited Cu layer, and if the thickness is reduced from the target value, sends the substrate to a tuning station to electroplate more Cu. As an example, let us assume that the Cu thickness for substrate #100 is reduced down to 160 nm although under the same plating conditions substrate #1 had a plated Cu thickness of 200 nm. When the Cu thickness is measured to be 160 nm for substrate #100, this substrate is forwarded to a tuning station, which may be another Cu plating station, and additional 40 nm of Cu plating is carried out. It should be noted that for better accuracy more metrology steps and tuning steps may be added to the process. In any case, use of the tuning station(s) provides excellent composition control of the precursor stack in a production environment where a large number of substrates are processed in a continuous manner. Similar approaches may be used for the deposition of the other components of the stack such as the In and/or Ga sub-layers. Metrology may be carried out on every substrate or at certain intervals, for example for every 10th substrate. Computer systems may be used to collect the metrology data and trends of thickness behavior may be established. This data may then be used to predict thickness as a function of the bath age. It can also be advantageous to use different baths for deposition and tuning, which deposition and tuning may use electroplating if material is being added.

Example 3

In a two-stage process employing an electrodeposited Cu—Ga/In precursor stack, the process may be carried out as follows: A Cu—Ga alloy may be first deposited on a substrate in the form of an initial film at a deposition station. The substrate may then be moved to a metrology station to determine the molar Cu and Ga content in this initial film. If more Cu is needed to reach the target composition, the substrate may be forwarded to a tuning station that deposits more Cu on the initial film. If more Ga is needed to reach the target composition, the substrate may be forwarded to a tuning station that deposits more Ga on the initial film. Once the Cu and Ga contents are brought to a targeted range an In sub-layer may be deposited to form the precursor stack. Indium sub-layer deposition may also be divided into at least two steps. In the first step an In initial film may be deposited over the Cu and Ga containing sub-layer. At a metrology station In content may be measured. Then at a tuning station In content may be brought to a targeted range. This way Cu, In and Ga content of the precursor stack may be brought to the pre-determined desired range.

Example 4

The method of the present invention may be used in a cluster tool approach where single substrates, such as pre-cut glass substrates, are coated with the precursor layers. Alternately, the invention may also be used in an in-line processing approach such as a roll-to-roll processing technique.

A $Cu(In,Ga)Se_2$ compound layer with a Cu/(In+Ga) ratio of 0.95 and Ga/(Ga+In) ratio of 0.3 may be grown using the present invention by first electrodepositing a Cu/In/Ga precursor stack on a flexible foil substrate and then reacting the stack with selenium, i.e. by selenizing the stack. It is straight forward to calculate that if the thickness of the Cu sub-layer in the stack is 200 nm, an In sub-layer thickness of 325 nm and a Ga sub-layer thickness of 104 nm would be needed to provide the target composition defined above. In processing such a stack, the foil substrate may be in the form of a roll. The Cu, In, and Ga layers may be deposited on the substrate in a roll-to-roll fashion. All depositions may be carried out in a single machine with Cu, In and Ga electroplating stations. They may alternately be carried out in two different machines, one tool electroplating two of the elements (such as Cu and In, Cu and Ga, or In and Ga) and the other tool depositing the third element. Alternately Cu deposition, In deposition and Ga deposition may be carried out in three different roll-to-roll plating machines or tools.

Figure 4:
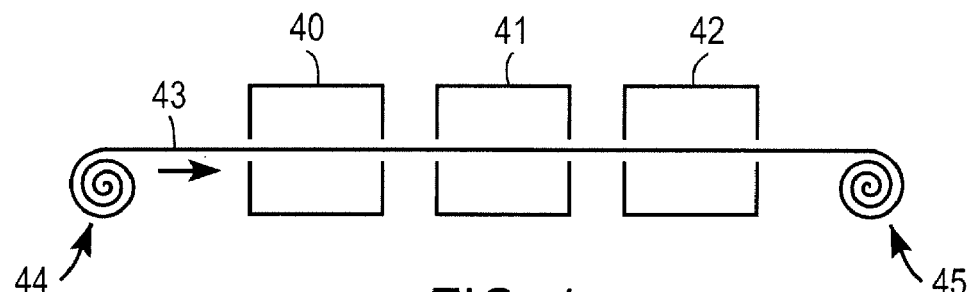
FIG. 4 shows a roll-to-roll electrodeposition system employing at least one deposition station, at least one metrology station and at least one tuning station.

FIG. 4 schematically shows an in-line, roll-to-roll Cu electroplating system comprising a deposition station 40, a metrology station 41 and a tuning station 42. As the flexible foil substrate 43 is moved from the supply spool 44 to the receiving spool 45, it gets plated by Cu. The movement of the foil substrate may be continuous or it may be step-wise to plate the substrate with Cu one section at a time. At any time during processing, the deposition station 40 may be activated to carry out electrodeposition of an initial Cu film on the portion of the foil substrate 43 that is within the deposition station 40. The tuning station 41 may not be ordinarily activated, i.e. it does not deposit Cu, unless it gets a signal from the metrology station 41. If and when metrology station senses a change in the Cu target thickness at a portion of the foil substrate 43, a signal is sent to the tuning station through a computer which determines the amount of additional Cu deposition to be carried out on the portion at the tuning station 41. Since the movement of the foil substrate 43 from left to right is controlled, the position of the portion at any time is also known. Therefore, when the portion moves into the tuning station 42 the plating cell is activated through application of a voltage between the foil substrate and an anode and the pre-determined additional Cu amount may be deposited on the portion. Subsequent to this the deposition conditions at the deposition station 40 and tuning station 42 may be kept constant until a new measurement is carried out at the metrology station 41 and the deposition condition at the tuning station is adjusted again to meet the target final Cu thickness on the substrate.

It should be noted that, in the embodiment discussed above, thickness measurement results from the metrology station are used to adjust the deposition conditions, such as the deposition current and/or voltage, at the tuning station, keeping the conditions constant at the deposition station. It is also possible that results from the metrology station may be interpreted by a computer to adjust the deposition conditions at the deposition station or both at the deposition station and the tuning station. For example, if the thickness of the initial Cu film deposited at the deposition station 40, as detected by the measurement at the metrology station 41, is low, then the deposition conditions at the deposition station 40 may be adjusted e.g. the deposition current density may be increased, so that future portions of the substrate 43 to be plated receive a Cu thickness that is closer to the target value. It is also possible to remove material, rather than deposit material, at the tuning station. For example, in wet processing such as electroplating, the tuning station may have an electrode in a solution and means to apply a voltage between the electrode and the surface of the substrate when the surface of the substrate is wetted by the solution. For deposition, a negative or cathodic voltage is applied to the substrate surface with respect to the electrode. This way, Cu, In or Ga may be deposited or plated on the substrate surface if the solution contain Cu, In or Ga species. If, on the other hand an anodic or positive voltage is applied to the substrate surface with respect to the electrode already deposited material may be anodically dissolved from the substrate surface. For example, if the deposition station 40 in FIG. 4 deposits Cu on the substrate 43, and if the metrology station 41 detects that the thickness of the deposited Cu is more than a target thickness, then when that portion of the substrate enters the tuning station 42, an anodic removal step may be carried out to bring the thickness to the targeted value. Cu removal rate and amount may be controlled by the current density applied between the substrate surface and the electrode in the tuning station.

The processes described for Cu deposition may also be carried out for the In and Ga depositions and a precursor stack comprising Cu, Ga and In may be produced with well defined stoichiometry or composition.

Once the precursor layers of the present invention are deposited reaction of the precursors with Group VIA materials may be achieved various ways. In one embodiment the precursor layer is exposed to Group VIA vapors at elevated temperatures. These techniques are well known in the field and they involve heating the precursor layer to a temperature range of 350-600° C. in the presence of at least one of Se vapors, S vapors, and Te vapors provided by sources such as solid Se, solid S, solid Te, $H_2Se$ gas, $H_2S$ gas etc. for periods ranging from 5 minutes to 1 hour. In another embodiment a layer or multi layers of Group VIA materials are deposited on the precursor layer and the stacked layers are then heated up in a furnace or in a rapid thermal annealing furnace and like. Group VIA materials may be evaporated on, sputtered on or plated on the precursor layer. Alternately inks comprising Group VIA nano particles may be prepared and these inks may be deposited on the precursor layers to form a Group VIA material layer comprising Group VIA nano particles. Dipping, spraying, doctor-blading or ink writing techniques may be employed to deposit such layers. Reaction may be carried out at elevated temperatures for times ranging from 1 minute to 30 minutes depending upon the temperature. As a result of reaction, the Group IBIIIAVIA compound is formed from the precursor.

Solar cells may be fabricated on the compound layers of the present invention using materials and methods well known in the field. For example a thin (<0.1 microns) CdS layer may be deposited on the surface of the compound layer using the chemical dip method. A transparent window of ZnO may be deposited over the CdS layer using MOCVD or sputtering techniques. A metallic finger pattern is optionally deposited over the ZnO to complete the solar cell.

Although the present invention is described with respect to certain preferred embodiments, modifications thereto will be apparent to those skilled in the art.

What is claimed:

1. A method of electroplating a stacked layer of a plurality of films in a plurality of sequentially disposed electroplating units onto a continuously moving roll-to-roll sheet to manufacture solar cells, the method comprising the steps of:

continuously moving the roll-to-roll sheet through each of the plurality of sequentially disposed electroplating units so that continuous portions of a top surface of the roll-to-roll sheet are positioned for electroplating to occur thereover when disposed in each of the electroplating units;

continuously electroplating each one of the films over the top surface of the roll-to-roll sheet using each of the electroplating units as the roll-to-roll sheet moves therethrough, wherein the roll-to-roll sheet includes Cu, In and Ga elements;

detecting a thickness of at least one of the films electroplated over a portion of the roll-to-roll sheet and generating a thickness signal corresponding thereto;

wherein the step of continuously electroplating includes at least one of adjusting the thickness of each of the films toward a predetermined thickness value for that film using the thickness signal for that film for a subsequent portion of the roll-to-roll sheet that follows the portion of the roll-to-roll sheet, and after the step of detecting, tuning the plurality of films based on the amount of each of the elements deposited so that the stacked layer of the plurality of films has a predetermined molar ratio range of the elements;

applying Se to at least one of the plurality of films;

reacting the plurality of films within a particular portion of the roll-to-roll sheet and the Cu, In and Ga elements therein with Se to form a $Cu(In,Ga)Se_2$ absorber layer after completion of the steps of continuously moving, continuously electroplating, detecting and applying for the particular portion of the roll-to-roll sheet; and forming a transparent layer, including a CdS film and a ZnO film, on the $Cu(In,Ga)Se_2$ absorber layer associated with the particular portion of the roll-to-roll sheet, thereby obtaining at least one solar cell disposed within the particular portion of the roll-to-roll sheet.

2. The method according to claim 1 wherein the step of continuously electroplating adjusts the thickness of each of the films toward the predetermined thickness value for that film using the thickness signal for that film for the subsequent portion of the roll-to-roll sheet that follows the portion of the roll-to-roll sheet; and wherein the step of detecting the thickness detects the thickness of each of the films.

3. The method according to claim 2 wherein the plurality of sequentially disposed electroplating units comprise at least one Cu electroplating unit, at least one Ga electroplating unit and at least one In electroplating unit.

4. The method according to claim 2 wherein the step of detecting is performed using X-ray fluorescence.

5. The method according to claim 2 wherein the step of adjusting alters a deposition current density used by the electroplating unit based upon the thickness signal, thereby adjusting the thickness of the subsequent portion of the film.

6. The method according to claim 2 wherein the step of adjusting alters an effective electroplating length used by the electroplating unit based upon the thickness signal, thereby adjusting the thickness of the subsequent portion of the film.

7. The method according to claim 2 wherein the step of detecting detects the thickness of the film at a plurality of locations across a width of the continuously moving roll-to-roll sheet to obtain a corresponding plurality of thickness signals; and wherein the step of adjusting adjusts the thickness of the film toward the predetermined thickness value using the plurality of thickness signals for a subsequent portion of the roll-to-roll sheet that follows the portion of the roll-to-roll sheet, such that the thickness is adjusted taking into consideration the location of the detecting.

8. The method according to claim 7 wherein the corresponding plurality of thickness signals each control a current density of a corresponding plurality of anodes for the step of adjusting.

9. The method according to claim 7 wherein the corresponding plurality of thickness signals each control an effective electroplating length of a corresponding plurality of anodes for the step of adjusting.

10. The method according to claim 7 wherein the step of detecting is performed using X-ray fluorescence.

11. The method according to claim 1 wherein the step of continuously electroplating includes,
after the step of detecting, tuning the plurality of films based on the amount of each of the elements deposited so that the stacked layer of the plurality of films has the predetermined molar ratio range.

12. The method according to claim 11 wherein the step of tuning deposits another film that includes one of the elements used for the predetermined molar ratio range.

13. The method according to claim 12 wherein the step of tuning deposits the another film using at least one of the plurality of sequentially disposed electroplating units.

14. The method according to claim 11 wherein;
the step of tuning removes a portion of a top one of the plurality of films.

15. The method according to claim 14 wherein the step of tuning removes the portion using at least one of the plurality of sequentially disposed electroplating units.

16. The method according to claim 11 wherein the step of detecting is performed using X-ray fluorescence.

17. The method according to claim 11 wherein the step of detecting occurs a plurality of times, respectively after each of the plurality of films has been applied, and further including a step of obtaining an actual molar ratio range from measurements obtained in each of the plurality of detecting steps.

18. The method according to claim 11 wherein the step of depositing uses electroplating in one of the plurality of sequentially disposed electroplating units that includes a bath, and the step of tuning includes the step of electroplating out of another one of the plurality of sequentially disposed electroplating units that includes another bath that is different than the bath.

19. The method according to claim 1 wherein the step of continuously electroplating includes:
continuously electroplating a first film of the plurality of films onto the top surface of the continuously moving roll-to-roll sheet;
wherein the step of detecting includes detecting a thickness of the first film and generating a thickness signal corresponding thereto;
wherein the step of continuously electroplating further includes continuously electroplating a second film of the plurality of films over the first film, the second film having a composition that is different from the first film, and
wherein a thickness of the electroplated second film is controlled by the thickness signal of the first film.

20. The method according to claim 19 wherein the first film includes at most two of the Cu, In and Ga elements, and wherein the second film includes at least one of the Cu, In and Ga elements that was not included in the first film.

21. The method according to claim 19 wherein the control by the thickness signal results in a substantially same molar ratio of a first element in the first film to a second element in the second film at substantially each location along the moving substrate.

22. The method according to claim 21 wherein the first material and the second material each include at least one of Cu, In and Ga.

23. The method according to claim 22 wherein the top surface comprises at least one of Ru, Os and Ir.

24. The method according to claim 23 wherein the step of detecting is performed using X-ray fluorescence.

25. The method according to claim 19 wherein the step of detecting is performed using X-ray fluorescence.

26. The method according to claim 19 wherein the first film is comprised of at least a first sub-film and second sub-film, each of the first and second sub-films being separately electroplated;
wherein the step of detecting detects the thickness of both sub-films at the same time, thereby resulting in a first sub-film thickness signal and a second sub-film thickness signal; and
wherein the first sub-film thickness signal and the second sub-film thickness signal are both used to generate the thickness signal used in the step of continuously electroplating the second film.

27. The method according to claim 26 wherein the step of detecting is performed using X-ray fluorescence.

28. The method according to claim 26 wherein the first sub-film is Cu and the second sub-film is Ga.

29. The method according to claim 28 further including the step of heat treating the first film prior to the step of detecting.

30. The method according to claim 19 further including the step of electroplating a third material over the second film.

31. The method according to claim 19 further including the steps of:
continuously electroplating a third film onto the second film using an electroplating unit as the roll-to-roll sheet moves therethrough; and
detecting a thickness of the third film electroplated onto a portion of the second film and generating another thickness signal corresponding thereto;
wherein the step of continuously electroplating the third film includes the step of adjusting the thickness of the third film toward a predetermined thickness value using the another thickness signal for a subsequent portion of the roll-to-roll sheet that follows the portion of the roll-to-roll sheet.

32. The method according to claim 31 wherein both steps of detecting are performed using X-ray fluorescence.

33. The method according to claim 19 wherein the step of detecting detects the thickness of the first film at a plurality of locations across a width of the continuously moving roll-to-roll sheet to obtain a corresponding plurality of thickness signals;
wherein the step of adjusting adjusts the thickness of the second film using the plurality of thickness signals for a subsequent portion of the roll-to-roll sheet that follows the portion of the roll-to-roll sheet, such that the thickness is adjusted taking into consideration the location of the detecting.

34. The method according to claim 31, wherein the step of reacting comprises heating the precursor stack in a gas containing Se.

* * * * *